United States Patent
Furukawa

(10) Patent No.: US 10,490,657 B2
(45) Date of Patent: Nov. 26, 2019

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Masaru Furukawa, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/918,070

(22) Filed: Mar. 12, 2018

(65) Prior Publication Data
US 2019/0088775 A1    Mar. 21, 2019

(30) Foreign Application Priority Data
Sep. 19, 2017 (JP) .................... 2017-178776

(51) Int. Cl.
| H01L 29/78 | (2006.01) |
| H01L 29/16 | (2006.01) |
| H01L 29/66 | (2006.01) |
| H01L 21/04 | (2006.01) |
| H01L 29/45 | (2006.01) |

(Continued)

(52) U.S. Cl.
CPC ........ *H01L 29/7806* (2013.01); *H01L 21/049* (2013.01); *H01L 21/0465* (2013.01); *H01L 21/0485* (2013.01); *H01L 21/0495* (2013.01); *H01L 29/1095* (2013.01); *H01L 29/1608* (2013.01); *H01L 29/45* (2013.01); *H01L 29/47* (2013.01); *H01L 29/66068* (2013.01)

(58) Field of Classification Search
CPC ... H01L 21/049; H01L 21/45; H01L 21/0465; H01L 29/7806; H01L 29/1095; H01L 29/1608; H01L 29/66068
See application file for complete search history.

(56) References Cited

U.S. PATENT DOCUMENTS

2007/0023781 A1    2/2007  Mizukami et al.
2012/0286290 A1*  11/2012  Uchida .............. H01L 29/7828
                                              257/77

(Continued)

FOREIGN PATENT DOCUMENTS

| JP | 2007-036052 A | 2/2007 |
| JP | 2013-089723 A | 5/2013 |
| WO | 2016-110953 A1 | 7/2016 |

*Primary Examiner* — Galina G Yushina
(74) *Attorney, Agent, or Firm* — White & Case LLP

(57) ABSTRACT

According to an embodiment, a semiconductor device includes a substrate, a first semiconductor region, a second semiconductor region, a third semiconductor region, fourth semiconductor regions, and a first electrode. The second semiconductor region is provided on the first semiconductor region. The second semiconductor region includes a first portion and a second portion connected to the first portion in a first direction parallel to the first surface of the substrate. A conductivity type of the second semiconductor region is a second conductivity type. The first electrode is provided on the first portion of the second semiconductor region, the third semiconductor region, and the fourth semiconductor regions and is in contact with the first portion of the second semiconductor region.

19 Claims, 3 Drawing Sheets

(51) Int. Cl.
*H01L 29/10* (2006.01)
*H01L 29/47* (2006.01)

(56) References Cited

U.S. PATENT DOCUMENTS

| | | | |
|---|---|---|---|
| 2015/0091082 A1* | 4/2015 | Tanaka | H01L 29/7802 257/329 |
| 2017/0271467 A1* | 9/2017 | Kono | H01L 29/45 |
| 2017/0301783 A1 | 10/2017 | Ebiike | |

* cited by examiner

SEMICONDUCTOR DEVICE

CROSS-REFERENCE TO RELATED APPLICATIONS

This application is based upon and claims the benefit of priority from Japanese Patent Application No. 2017-178776, filed on Sep. 19, 2017; the entire contents of which are incorporated herein by reference.

FIELD

Embodiments of the invention relate generally to a semiconductor device.

BACKGROUND

MOSFET (metal oxide semiconductor field effect transistor) is a semiconductor device used for applications such as power control. In some cases, the MOSFET is made of silicon carbide in order to reduce e.g. switching loss.

In a semiconductor device containing silicon carbide, the bipolar operation of the parasitic diode in the MOSFET may generate crystal defects and increase the on-resistance and leakage current. There has been proposed a structure incorporating a Schottky barrier diode in order to suppress such bipolar operation by the MOSFET. However, incorporation of a Schottky barrier diode causes concern about the increase of ROA (roll-off amount).

DETAILED DESCRIPTION

Figure 1:
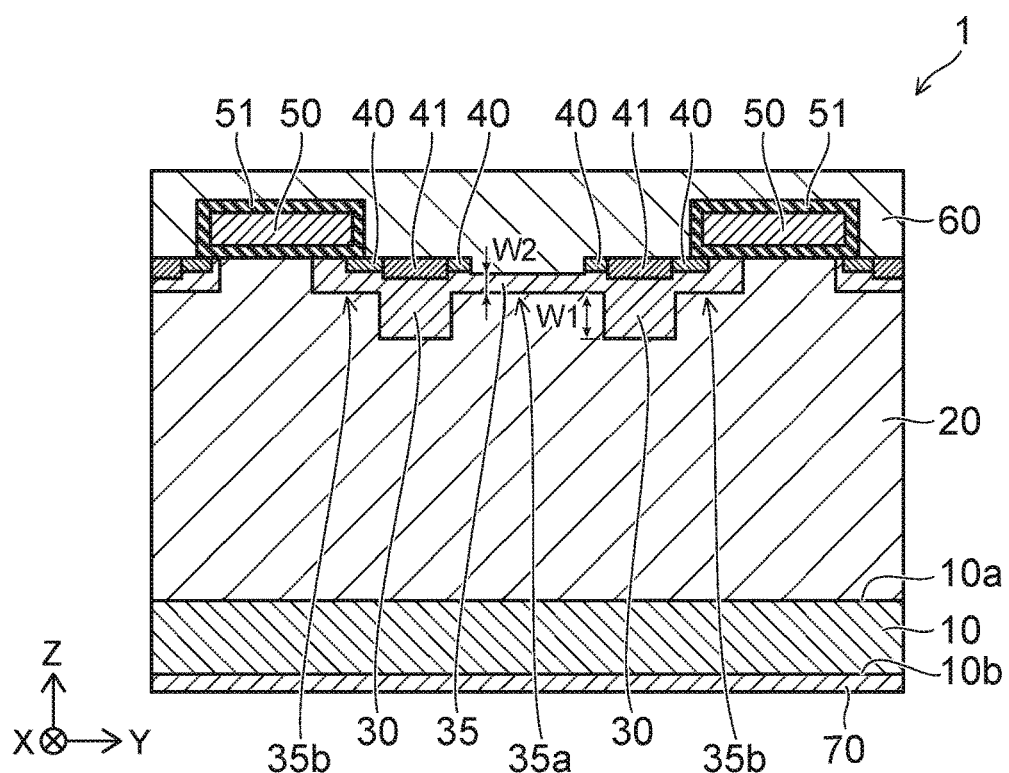
FIG. 1 is a sectional view showing a semiconductor device according to a first embodiment.

According to an embodiment, a semiconductor device includes a substrate, a first semiconductor region, a second semiconductor region, a third semiconductor region, fourth semiconductor regions, and a first electrode. The first semiconductor region is provided on a first surface of the substrate. A conductivity type of the first semiconductor region is a first conductivity type. The second semiconductor region is provided on the first semiconductor region. The second semiconductor region includes a first portion and a second portion connected to the first portion in a first direction parallel to the first surface of the substrate. A conductivity type of the second semiconductor region is a second conductivity type. The third semiconductor region is provided on the second portion of the second semiconductor region. A conductivity type of the third semiconductor region is the second conductivity type. The fourth semiconductor regions are provided on the second portion of the second semiconductor region, the third semiconductor region being located between the fourth semiconductor regions in the first direction. A conductivity type of the fourth semiconductor regions is the first conductivity type. The first electrode is provided on the first portion of the second semiconductor region, the third semiconductor region, and the fourth semiconductor regions and is in contact with the first portion of the second semiconductor region.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

First Embodiment

FIG. 1 is a sectional view showing a semiconductor device 1.

As shown in FIG. 1, the semiconductor device 1 is provided with a substrate 10, a semiconductor region 20 of a first conductivity type, a semiconductor region 30 of a second conductivity type, a semiconductor region 35 of the second conductivity type, a semiconductor region 40, a contact region 41, a gate electrode 50, an insulating film 51, a source electrode 60, and a drain electrode 70.

In the following, an XYZ orthogonal coordinate system is adopted in this specification. Two directions parallel to the first surface 10a of the substrate 10 and orthogonal to each other are referred to as "X-direction" and "Y-direction". The direction orthogonal to both the X-direction and the Y-direction is referred to as "Z-direction". FIG. 1 shows a Y-Z cross section of the semiconductor device 1.

The following describes an example in which the first conductivity type is n-type and the second conductivity type is p-type.

The substrate 10 is e.g. a semiconductor substrate containing silicon carbide (SiC). For instance, the conductivity type of the substrate 10 is $n^+$-type. The substrate 10 functions as e.g. a drain region. The substrate 10 has a first surface 10a and a second surface 10b. The second surface 10b is a surface on the opposite side from the first surface 10a.

The term "$n^+$-type" refers to n-type with the effective impurity concentration higher than "$n^-$-type". The same also applies to "$p^+$-type" and "$p^-$-type". The "effective impurity concentration" refers to the concentration of impurity contributing to the conductivity of a semiconductor material. In the case where the semiconductor material contains both an impurity serving as a donor and an impurity serving as an acceptor, the effective impurity concentration is defined as the concentration except the amounts canceling out each other. The n-type impurity is e.g. phosphorus (P). The p-type impurity is e.g. boron (B).

The semiconductor region 20 is provided on the first surface 10a of the substrate 10 and contains e.g. silicon carbide. The conductivity type of the semiconductor region 20 is e.g. $n^-$-type. The semiconductor region 20 is e.g. a drift region.

The semiconductor region 30 is provided in a plurality on the semiconductor region 20 and contains e.g. silicon carbide. The conductivity type of the semiconductor region 30 is e.g. $p^-$-type. The semiconductor regions 30 extend in the X-direction and are spaced from each other in the Y-direction. The semiconductor region 30 is shaped like e.g. a rectangular solid. That is, the semiconductor region 20 is located between the semiconductor regions 30 adjacent in the Y-direction. The Z-direction thickness W1 of the semiconductor region 30 is e.g. 0.5 micrometers or more and 1.5 micrometers or less.

The semiconductor region 35 is provided in a plurality on the semiconductor region 20 and the semiconductor region 30 and contains e.g. silicon carbide. The conductivity type of the semiconductor region 35 is e.g. $p^-$-type. The semiconductor region 35 extends in the X-direction. For instance, the material of the semiconductor region 35 is the same as the material of the semiconductor region 30.

The semiconductor region 35 includes a first portion 35a and a second portion 35b. In the Z-direction, the first portion 35a is located between the semiconductor region 20 and the source electrode 60. The Z-direction thickness W2 of the first portion 35a is e.g. 500 nanometers or less.

In the Z-direction, the second portion 35b is located between the semiconductor region 40 and the contact region 41 on one hand and the semiconductor region 20 and the semiconductor region 30 on the other. The second portion 35b is located on both Y-direction sides of the first portion 35a.

At the time of operation of the MOSFET, an electric field is formed in the direction (Z-direction) from the substrate 10 to the semiconductor region 20. The semiconductor region 30 is provided so as to protrude from the semiconductor region 35 in the direction (−Z-direction) from the semiconductor region 20 to the substrate 10. This relaxes the Z-direction electric field at the time of operation of the MOSFET. Relaxation of the electric field by the semiconductor region 30 can reduce the influence of such an electric field exerted on the elements in the semiconductor device 1.

The semiconductor region 40 is provided in a plurality on the semiconductor region 35 and contains e.g. silicon carbide. The conductivity type of the semiconductor region 40 is e.g. $n^+$-type. The semiconductor region 40 is e.g. a source region. The semiconductor region 40 is located on the surface of the second portion 35b on the opposite side from the surface provided with the semiconductor region 30. The semiconductor regions 40 extend in the X-direction and are spaced from each other in the Y-direction.

The contact region 41 is provided in a plurality on the semiconductor region 35 and contains e.g. silicon carbide. The contact region 41 is a semiconductor region, and its conductivity type is e.g. $p^+$-type. The contact region 41 is located on the surface of the second portion 35b on the opposite side from the surface provided with the semiconductor region 30. The contact regions 41 extend in the X-direction and are spaced from each other in the Y-direction. The contact region 41 is located between the semiconductor regions 40 adjacent in the Y-direction, As viewed in the Z-direction, the contact region 41 is included in the semiconductor region 30 in the Y-direction.

The gate electrode 50 is provided in a plurality on the semiconductor region 20, the semiconductor region 35, and the semiconductor region 40 via the insulating film 51. The gate electrodes 50 extend in the X-direction and are spaced from each other in the Y-direction. The gate electrode 50 contains e.g. a metal material. The gate electrode 50 contains e.g. at least one of metals such as nickel (Ni), aluminum (Al), titanium (Ti), tungsten (W), molybdenum (Mo), copper (Cu), gold (Au), and platinum (Pt).

The insulating film 51 is provided on the gate electrode 50. For instance, the insulating film 51 is located on the surface of the gate electrode 50. For instance, the insulating film 51 includes an interlayer insulating film located on the upper surface and on the side surface of the gate electrode 50, and a gate insulating film located on the lower surface of the gate electrode 50. The insulating film 51 contains e.g. silicon oxide (SiO).

A gate contact (not shown) is provided in the outer peripheral part of the semiconductor device 1. For instance, the gate contact is composed of an interconnect and a pad and located in the outer peripheral part of a chip. The gate electrode 50 is electrically connected to the gate contact. The gate electrode 50 is electrically connected to an external circuit through the gate contact. The gate electrode 50 is applied with a voltage more than or equal to a threshold through the gate contact. Thus, the MOSFET is turned on, and a channel (inversion layer) is formed in the semiconductor region 35.

The source electrode 60 is provided on the semiconductor region 35, the semiconductor region 40, the contact region 41, and the insulating film 51. The source electrode 60 contains e.g. a metal material. The source electrode 60 contains e.g. at least one of metals such as nickel, aluminum, titanium, tungsten, molybdenum, copper, gold, and platinum.

The drain electrode 70 is provided on the second surface 10b of the substrate 10. The drain electrode 70 contains e.g. a metal material. The drain electrode 70 contains e.g. at least one of metals such as nickel, aluminum, titanium, tungsten, molybdenum, copper, gold, and platinum.

The semiconductor device 1 is composed of a MOSFET and a Schottky barrier diode (hereinafter also referred to as SBD) connected parallel to each other. More specifically, the MOSFET is composed of the substrate 10, the semiconductor regions 20, 30, 35, 40, the contact region 41, the gate electrode 50, the insulating film 51, the source electrode 60, and the drain electrode 70. The SBD is composed of the substrate 10, the semiconductor regions 20, 35, the source electrode 60, and the drain electrode 70.

As shown in FIG. 1, in the Z-direction, the semiconductor region 30 and the second portion 35b of the semiconductor region 35 are located between the semiconductor region 20 on one hand and the semiconductor region 40 and the contact region 41 on the other. Thus, the semiconductor regions 30, 35 function as a base layer (base region) of the MOSFET. The first portion 35a of the semiconductor region 35 is located between the semiconductor region 20 and the source electrode 60. Thus, the semiconductor region 35 functions as a contact layer (a contact of the Schottky barrier layer) with the source electrode 60 of the SBD. That is, the semiconductor regions 30, 35 constitute the base layer of the MOSFET and the contact layer with the source electrode 60 of the SBD.

Next, the operation of the semiconductor device 1 is described.

In the operation of the MOSFET, the gate electrode 50 is applied with a voltage more than or equal to a threshold. Then, a channel is formed in the semiconductor region 35. Subsequently, the drain electrode is applied with a voltage. Then, a current flows from the drain electrode 70 to the source electrode 60 through the substrate 10, the semiconductor region 20, the channel of the semiconductor region 35, and the semiconductor region 40.

In the operation of the SBD, a current flows from source electrode 60 to the drain electrode 70 through the first portion 35a of the semiconductor region 35, the semiconductor region 20, and the substrate 10.

Next, a method for manufacturing the semiconductor device 1 is described.

Figure 2:
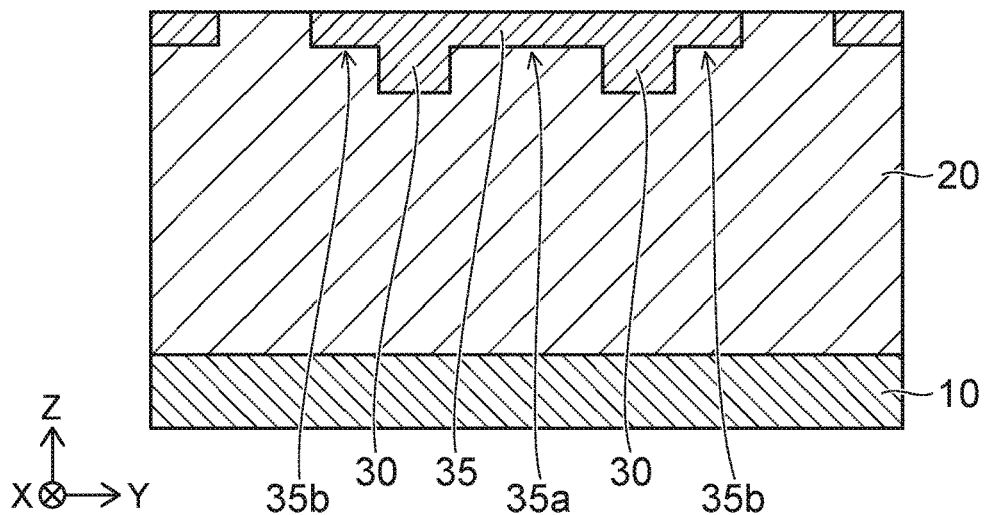
FIGS. 2 to 4 are sectional views showing a method for manufacturing the semiconductor device according to the first embodiment.
Figure 3:
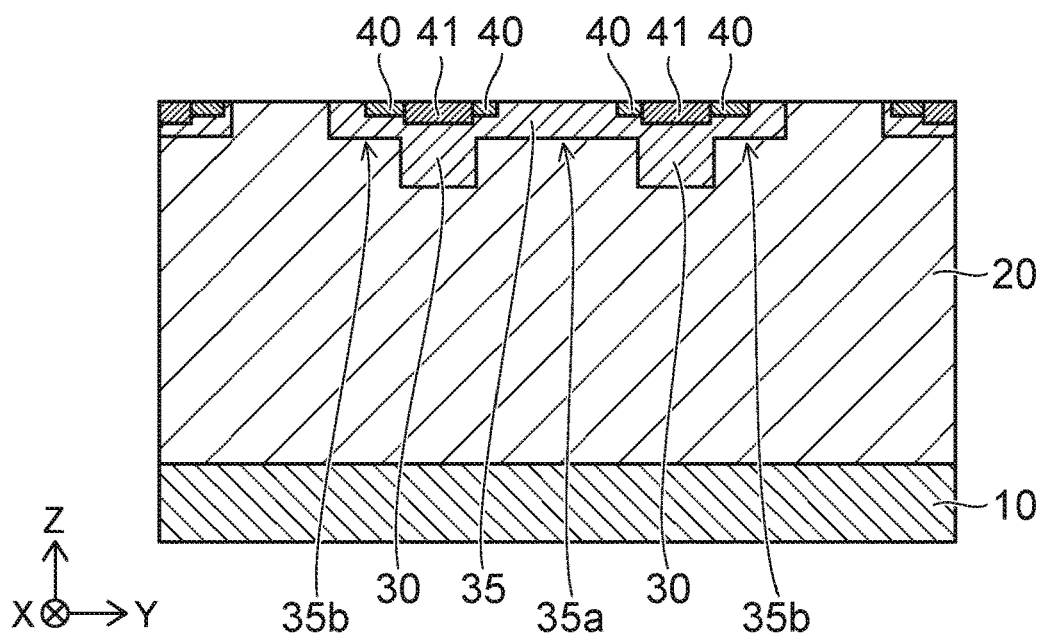
Figure 4:
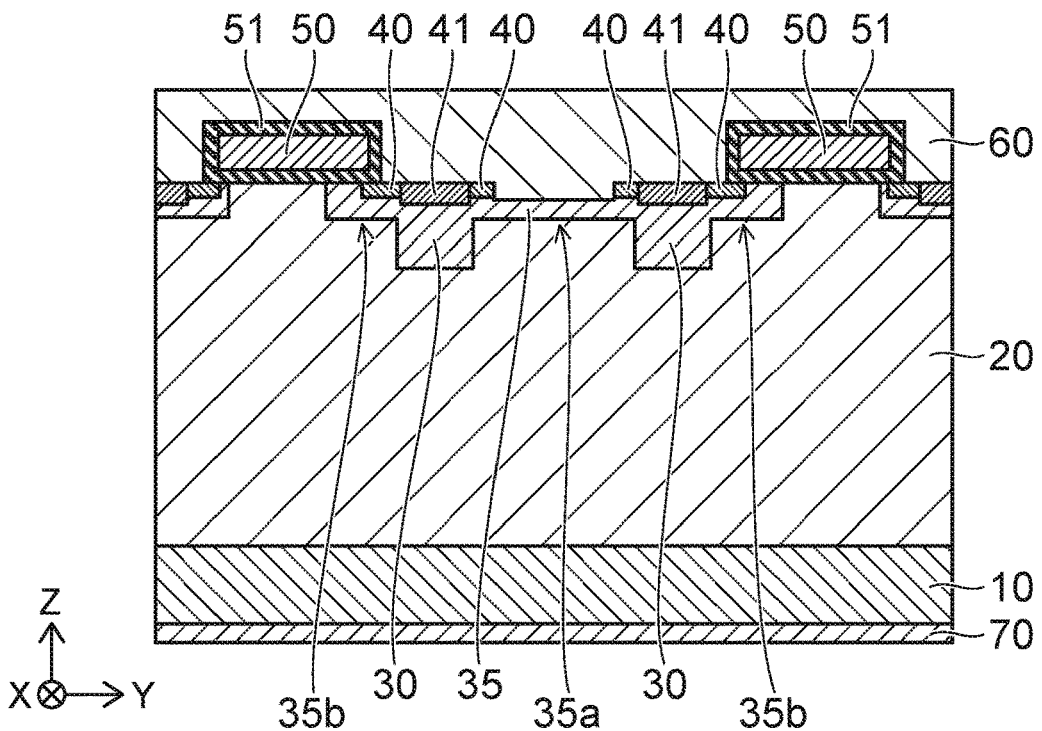

FIGS. 2 to 4 are sectional views showing a method for manufacturing the semiconductor device 1. The region shown in FIGS. 2 to 4 corresponds to the region shown in FIG. 1.

First, as shown in FIG. 2, a semiconductor layer is epitaxially grown on a substrate 10 to form a semiconductor region 20. For instance, the substrate 10 and the semiconductor region 20 contain n-type impurity.

Subsequently, a semiconductor region 30 and a semiconductor region 35 are each formed by e.g. the ion implantation method using a mask. For instance, the semiconductor region 30 and the semiconductor region 35 contain p-type impurity. The semiconductor region 35 includes a first portion 35a and a second portion 35b located on both Y-direction sides of the first portion 35a.

Next, as shown in FIG. 3, a semiconductor region 40 and a contact region 41 are each formed on the semiconductor region 35. The semiconductor region 40 and the contact region 41 are located on the second portion 35b of the semiconductor region 35. For instance, the semiconductor region 40 contains n-type impurity, and the contact region 41 contains p-type impurity.

Next, as shown in FIG. 4, an insulating film 51 and a gate electrode 50 are formed on the semiconductor regions 20, 35, 40 by e.g. the CVD (chemical vapor deposition) method. For instance, after a gate insulating film is formed on the semiconductor regions 20, 35, 40, the gate electrode 50 is formed on the gate insulating film. Then, an interlayer insulating film is formed on the gate electrode 50.

Subsequently, a source electrode 60 is formed on the semiconductor region 35, the semiconductor region 40, the contact region 41, and the insulating film 51. Then, a drain electrode 70 is formed.

Thus, the semiconductor device 1 is manufactured.

Next, the effect of this embodiment is described.

The semiconductor device 1 according to this embodiment is provided with the semiconductor regions 30, 35. The semiconductor region 30 is located on the semiconductor region 35 so as to protrude from the semiconductor region 35 in the −Z-direction. The semiconductor region 35 includes a first portion 35a and a second portion 35b. In the Z-direction, the first portion 35a is located between the semiconductor region 20 and the source electrode 60. In the Z-direction, the second portion 35b is located between the semiconductor region 40 and the contact region 41 on one hand and the semiconductor region 20 and the semiconductor region 30 on the other.

In this embodiment, the semiconductor regions 30, 35 constitute the base layer of the MOSFET and the contact layer with the source electrode 60 of the SBD. For instance, the semiconductor regions 30, 35 are formed from the same material. This enables commonality of the base layer of the MOSFET and the contact layer with the source electrode 60 of the SBD. The base layer of the MOSFET and the contact layer with the source electrode 60 of the SBD are formed integrally.

This can reduce the spacing between the elements in the semiconductor device 1 and miniaturize the semiconductor device 1.

This embodiment achieves commonality of the base layer of the MOSFET and the contact layer with the source electrode 60 of the SBD. This facilitates self-alignment of the channel formation region in the process for manufacturing the semiconductor device 1. Furthermore, for instance, the first portion 35a of the semiconductor region 35 is exposed between the regions including the semiconductor region 40 and the contact region 41. This suppresses misalignment with the semiconductor region 35. Thus, the region including the semiconductor region 40 and the contact region 41 can be formed easily. This facilitates the process for manufacturing the semiconductor device 1 and improves the yield.

In this embodiment, the semiconductor regions 30, 35 constitute the base layer of the MOSFET and the contact layer with the source electrode 60 of the SBD. Thus, the first portion 35a of the semiconductor region 35 is located between the semiconductor region 20 and the source electrode 60. At the time of operation of the MOSFET, a channel is formed in the second portion 35b of the semiconductor region 35 serving as a base layer. On the other hand, the first portion 35a of the semiconductor region 35 functions as a portion for adjusting the barrier height of the SBD. Thus, for instance, the barrier height of the SBD can be controlled by adjusting the Z-direction thickness W2 of the first portion 35a.

In this embodiment, the semiconductor region 30 is located on the semiconductor region 35 so as to protrude from the semiconductor region 35 in the −Z-direction. This relaxes the Z-direction electric field at the time of operation of the MOSFET and can reduce the influence of the electric field exerted on the elements in the semiconductor device 1.

This embodiment can provide a semiconductor device having improved reliability.

Second Embodiment

Figure 5:
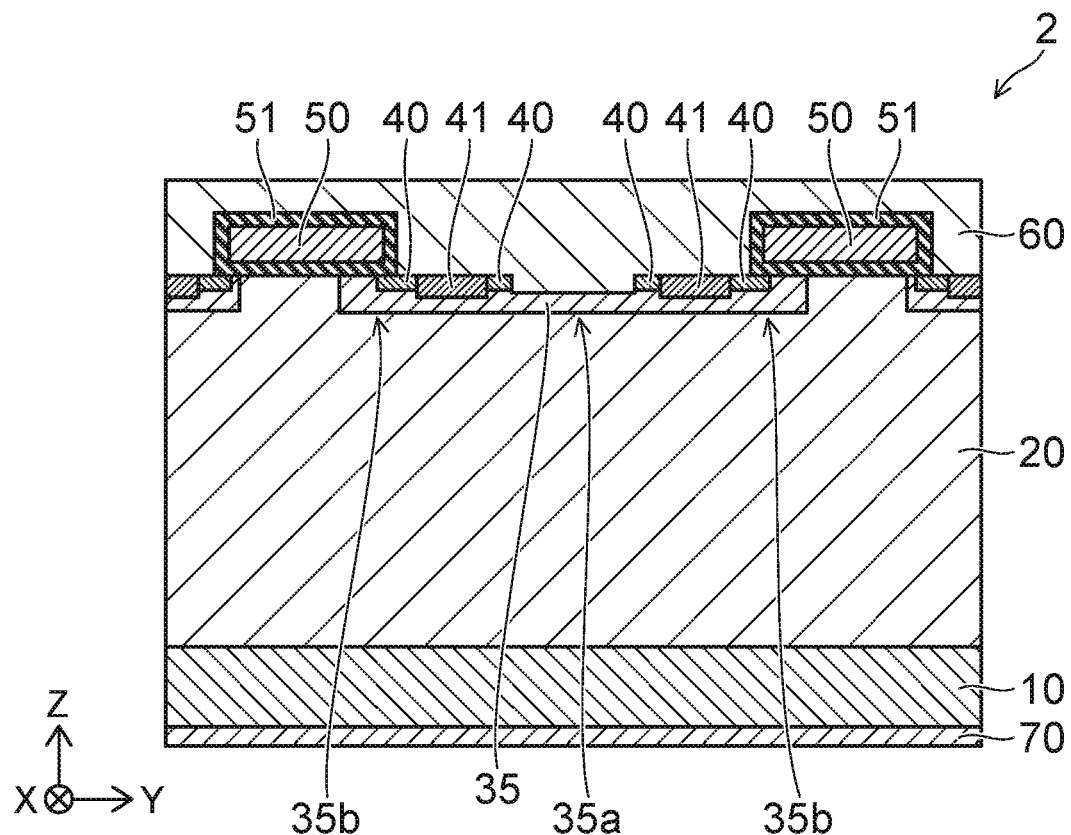
FIG. 5 is a sectional view showing a semiconductor device according to a second embodiment.

FIG. 5 is a sectional view showing a semiconductor device 2. The region shown in FIG. 5 corresponds to the region shown in FIG. 1.

This embodiment is different from the first embodiment in that the semiconductor region 30 is not provided. Thus, the detailed description of the rest of the configuration is omitted.

As shown in FIG. 5, the semiconductor device 2 is provided with a substrate 10, semiconductor regions 20, 35, 40, a contact region 41, a gate electrode 50, an insulating film 51, a source electrode 60, and a drain electrode 70.

The semiconductor region 35 is provided on the semiconductor region 20. The semiconductor region 35 is e.g. a base region. The semiconductor region 35 includes a first portion 35a and a second portion 35b. In the Z-direction, the first portion 35a is located between the semiconductor region 20 and the source electrode 60. In the Z-direction, the second portion 35b is located between the semiconductor region 40 and the contact region 41 on one hand and the semiconductor region 20 on the other. The second portion 35b is located on both Y-direction sides of the first portion 35a.

Next, the effect of this embodiment is described.

The semiconductor device 2 according to this embodiment is provided with the semiconductor region 35 including a first portion 35a and a second portion 35b. In the semiconductor region 35, in the Z-direction, the first portion 35a is located between the semiconductor region 20 and the source electrode 60. In the Z-direction, the second portion 35b is located between the semiconductor region 40 and the contact region 41 on one hand and the semiconductor region 20 on the other.

In this embodiment, the semiconductor region 35 constitutes the base layer of the MOSFET and the contact layer with the source electrode 60 of the SBD. The base layer of the MOSFET and the contact layer with the source electrode 60 of the SBD are formed integrally. This can reduce the spacing between the elements in the semiconductor device 2 and miniaturize the semiconductor device 2.

This embodiment facilitates self-alignment of the channel formation region in the process for manufacturing the semiconductor device 2. Furthermore, the first portion 35a of the semiconductor region 35 is exposed between the regions including the semiconductor region 40 and the contact region 41. This suppresses misalignment with the semiconductor region 35. Thus, the region including the semiconductor region 40 and the contact region 41 can be formed easily. This facilitates the process for manufacturing the semiconductor device 2 and improves the yield.

In this embodiment, at the time of operation of the MOSFET, a channel is formed in the second portion 35b of the semiconductor region 35 serving as a base layer. On the other hand, the first portion 35a of the semiconductor region 35 functions as a portion for adjusting the barrier height of the SBD. Thus, the barrier height of the SBD can be controlled.

This embodiment can provide a semiconductor device having improved reliability.

As described above, as an example, the semiconductor devices according to the embodiments have been described in the case where the first conductivity type is n-type and the second conductivity type is p-type. However, the first conductivity type may be p-type, and the second conductivity type may be n-type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a substrate;
   a first semiconductor region of a first conductivity type provided on a first surface of the substrate;
   a second semiconductor region of a second conductivity type provided on the first semiconductor region and including a first portion and a second portion connected to the first portion in a first direction parallel to the first surface of the substrate;
   a third semiconductor region of the second conductivity type provided on the second portion of the second semiconductor region;
   fourth semiconductor regions of the first conductivity type provided on the second portion of the second semiconductor region, the third semiconductor region being located between the fourth semiconductor regions in the first direction;
   a fifth semiconductor region of the second conductivity type provided on the second surface of the second portion and opposed to the third semiconductor region; and
   a first electrode provided on the first portion of the second semiconductor region, the third semiconductor region, and the fourth semiconductor regions and being in contact with the first portion of the second semiconductor region,
   the second portion of the second semiconductor region having a first surface on which the third semiconductor region and the fourth semiconductor regions are located and a second surface on opposite side from the first surface.

2. The device according to claim 1, wherein the second semiconductor region includes a same material as the fifth semiconductor region.

3. The device according to claim 1, wherein the fifth semiconductor region protrudes from the second semiconductor region in a second direction perpendicular to the first surface of the substrate.

4. The device according to claim 1, wherein the fifth semiconductor region is shaped like a rectangular solid.

5. The device according to claim 1, wherein in a second direction perpendicular to the first surface of the substrate, a thickness of the fifth semiconductor region is thicker than a thickness of the first portion of the second semiconductor region.

6. The device according to claim 1, wherein the second semiconductor region extends in a third direction parallel to the first surface of the substrate and crossing the first direction.

7. The device according to claim 1, wherein
   the substrate includes silicon carbide, and
   a conductivity type of the substrate is the first conductivity type.

8. The device according to claim 1, wherein an impurity concentration of the second semiconductor region is lower than an impurity concentration of the third semiconductor region.

9. The device according to claim 1, wherein the first electrode is selected from group comprising nickel, aluminum, titanium, tungsten, molybdenum, copper, gold, and platinum.

10. The device according to claim 1, wherein
    the substrate has a second surface on opposite side from the first surface,
    the device further comprising:
    a second electrode provided on the second surface of the substrate.

11. A semiconductor device comprising:
    a substrate;
    a first semiconductor region of a first conductivity type provided on a first surface of the substrate;
    a second semiconductor region of a second conductivity type provided on the first semiconductor region and including a first portion, a plurality of second portions, and a plurality of third portions provided on the second portions, the first portion being located between the second portions in a first direction parallel to the first surface of the substrate;
    a plurality of third semiconductor regions of the second conductivity type provided on a surface of the second semiconductor region on opposite side from a surface on which the third portions are located, the third semiconductor regions being opposed to the third portions;
    a plurality of fourth semiconductor regions of the first conductivity type provided on the surface of the second semiconductor region on the opposite side from the surface on which the third portions are located, the third semiconductor region being located between the fourth semiconductor regions in the first direction; and
    a first electrode provided on the first portion of the second semiconductor region, the third semiconductor regions, and the fourth semiconductor regions and being in contact with the first portion of the second semiconductor region.

12. The device according to claim 11, wherein the third portions of the second semiconductor region protrude from the second portion in a second direction perpendicular to the first surface of the substrate.

13. The device according to claim 11, wherein the third portions of the second semiconductor region are shaped like a rectangular solid.

14. The device according to claim 11, wherein in a second direction perpendicular to the first surface of the substrate, thicknesses of the third portions are thicker than a thickness of the first portion.

15. The device according to claim 11, wherein a part of the first semiconductor region is located between the third portions of the second semiconductor region in the first direction.

16. The device according to claim 11, wherein the second semiconductor region extends in a third direction parallel to the first surface of the substrate and crossing the first direction.

17. The device according to claim 11, wherein
the substrate contains silicon carbide, and
a conductivity type of the substrate is the first conductivity type.

18. The device according to claim 11, wherein an impurity concentration of the second semiconductor region is lower than an impurity concentration of the third semiconductor regions.

19. The device according to claim 11, wherein the first electrode is selected from group comprising nickel, aluminum, titanium, tungsten, molybdenum, copper, gold, and platinum.

* * * * *